United States Patent [19]

Soltau

[11] Patent Number: 5,650,746
[45] Date of Patent: Jul. 22, 1997

[54] CIRCUIT ARRANGEMENT FOR CAPACITANCE AMPLIFICATION

[75] Inventor: Andreas Soltau, Hamburg, Germany

[73] Assignee: U.S. Philips Corporation, New York, N.Y.

[21] Appl. No.: 532,285

[22] Filed: Jul. 11, 1995

[30]     Foreign Application Priority Data

Jul. 12, 1994 [DE] Germany .................. 44 24 527.0

[51] Int. Cl.$^6$ ........................................ H03G 3/02
[52] U.S. Cl. .................. 327/524; 327/103; 327/560; 327/563; 327/530
[58] Field of Search ...................... 327/524, 108, 327/306, 315, 324, 336, 552, 560, 103, 563, 530

[56]                 References Cited

U.S. PATENT DOCUMENTS 4,025,867   5/1977   Seidel .......................... 327/524
5,166,560  11/1992   Liu ............................. 327/524

OTHER PUBLICATIONS

"Design and Implementation of a CMOS VCXO for FM Stereo Decoders", by H. Qiuting et al, IEEE Journal of Solid–State Circuits, vol. 23, No. 3, Jun. 1988, pp. 784–793.

*Primary Examiner*—Timothy P. Callahan
*Assistant Examiner*—Dinh T. Le
*Attorney, Agent, or Firm*—Bernard Franzblau

[57]              ABSTRACT

A simple circuit arrangement for amplifying the effect of a capacitance. The input of the circuit arrangement is connected to an output of a current mirror circuit and, via the capacitance, to an input of the current mirror circuit to which a constant current (I) of known magnitude is applied. The degree of amplification of the effect of the capacitance is dependent on the area ratio n between the input transistor and the output transistor of the current mirror circuit. A constant current (n·I) is applied to the output of the current mirror circuit and is equal to the current applied to the input of the current mirror circuit multiplied by the area ratio n.

18 Claims, 3 Drawing Sheets

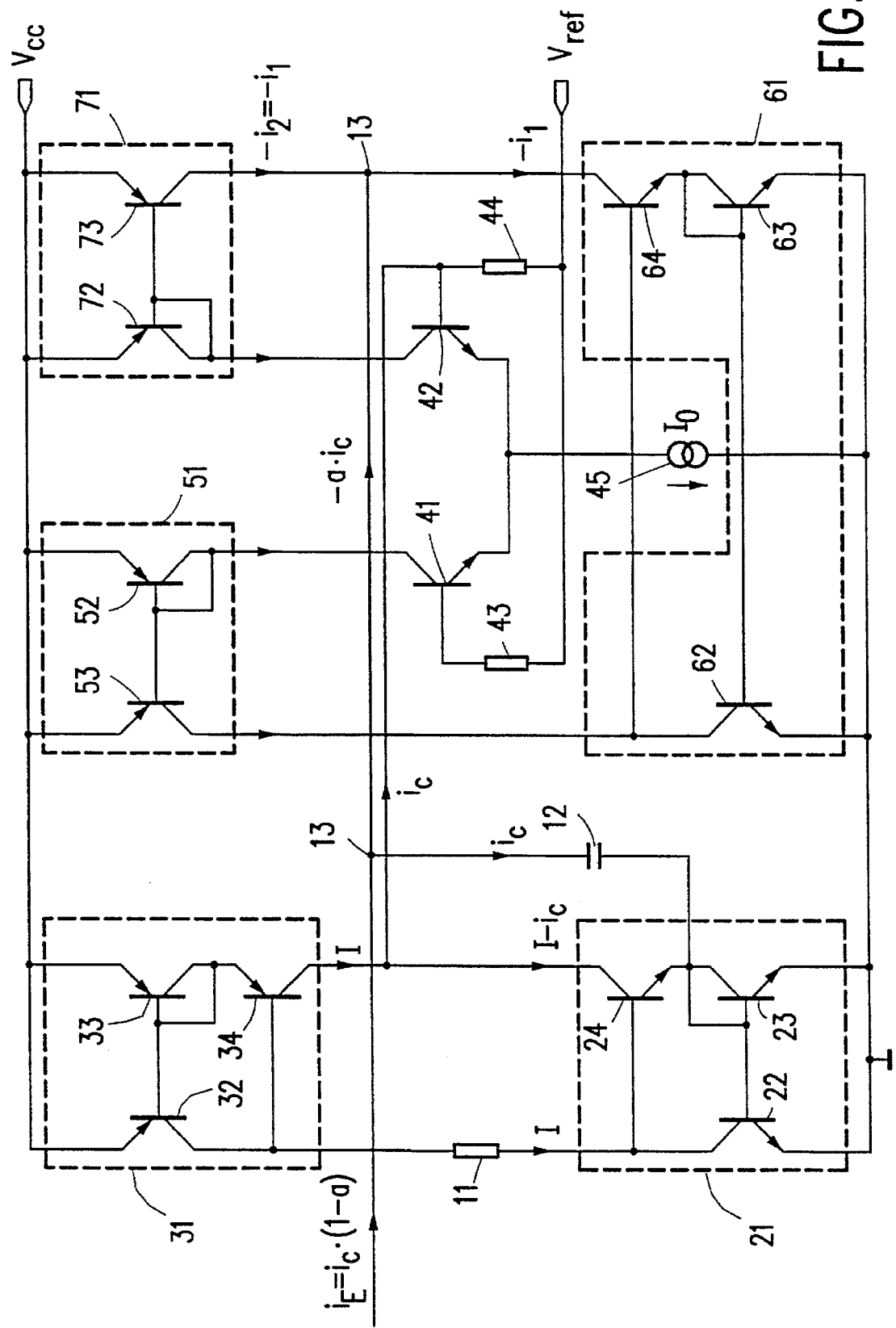

CIRCUIT ARRANGEMENT FOR CAPACITANCE AMPLIFICATION

BACKGROUND OF THE INVENTION

This invention relates to a circuit arrangement for amplifying the effect of a capacitance.

In integrated circuits the problem arises that large capacitance values cannot be realised because the emitter area which they require is too large. Therefore, such a large capacitance either should be provided externally or should be simulated electronically in the circuit on the IC. For this purpose the paper "Design and Implementation of a CMOS VCXO for FM Stereo Decoders", in the IEEE Journal of Solid-State Circuits, Vol. 23, No. 3, June 1988, pp. 784 to 793 describes a circuit arrangement in which large capacitance values are simulated electronically. This is achieved by means of a circuit comprising operational amplifiers.

SUMMARY OF THE INVENTION

It is an object of the invention to provide a circuit arrangement for electronically amplifying the effect of a capacitance, which circuit arrangement is of a construction which is as simple as possible.

In a first embodiment of the invention this object is achieved in that the input of the circuit arrangement is connected to an output of a current mirror circuit and, via the capacitance, to an input of the current mirror circuit, to which input a constant current of known magnitude is applied, the degree of amplification of the effect of the capacitance being dependent on the area ratio n between the input transistor of the current mirror circuit and the output transistor of the current mirror circuit, and in that a constant current is applied to the output of the current mirror circuit, which constant current is equal to the current applied to the input of the current mirror circuit, multiplied by the area ratio n.

The current mirror circuit amplifies the sum of its input currents in accordance with the ratio between the area of its input transistor and of its output transistor. The two constant currents applied to the input and the output, respectively, of the current mirror circuit are chosen in accordance with this area ratio. The constant current applied to the output should be larger than the constant current applied to the input of the current mirror circuit in proportion to the gain and hence the area ratio of the transistors of the current mirror circuit.

In addition to the constant current the input receives a current which flows through the capacitance whose effect is to be amplified electronically. The current mirror circuit also amplifies this current in proportion to the area ratio of the transistors of the current mirror circuit. The current thus amplified appears at the output of the current mirror circuit. The constant current applied to the input also appears at the output but is compensated by the constant current applied to the output of the current mirror circuit. Since the output of the current mirror circuit also constitutes both the input and the output of the circuit arrangement only the current amplified by the gain factor of the current mirror circuit will flow through the capacitance. The input/output of the entire circuit arrangement thus carries a current which flows through the capacitance and, moreover, the current which is not compensated by the constant current at the output of the current mirror circuit.

If the area ratio is 1:1 the current through the capacitance and the current at the output of the current mirror circuit, which has been amplified by unity and has consequently remained constant in magnitude, then add up in the input signal, so that this current appears in duplicate. Thus, in the case of an area ratio of 1:1 the current through the capacitance is amplified by a factor of 2. In the case of an area ratio of 1:2 the current flowing at the input of the entire circuit arrangement is three times the current through the capacitance.

A great advantage of this arrangement is its very simple construction. It merely requires a current mirror circuit on which two constant currents are impressed. This arrangement amplifies the current through the capacitance in accordance with the area ratio n of the transistors. Such a circuit arrangement is particularly suitable for integrated circuits in which large capacitances cannot be realised owing to the area they require. It is sufficient to have a small capacitance whose effect is amplified by means of the simple circuit arrangement in accordance with the invention.

In a variant of this first embodiment of the invention the input of the current mirror circuit is coupled to the input of a second current mirror circuit via a resistor, the outputs of the two current mirror circuits are coupled to one another, and the two current mirror circuits have the same area ratio between their input and output transistors.

The second current mirror circuit serves to impress the desired currents upon the input and the output of the first current mirror circuit. The two current mirror circuits are interconnected by their inputs, the value of the resistor determining which current flows into the input of the first current mirror circuit. Both current mirror circuits should have the same area ratio, i.e. the same current gain. This results in the same constant current at the outputs of both current mirror circuits, the connection point being connected to the input of the entire circuit arrangement to take off the capacitance current which has been additionally amplified by the first current mirror circuit.

In a second embodiment the afore-mentioned object is achieved in that there is provided a Wilson current mirror circuit, which comprises a first transistor whose collector forms the input of the current mirror circuit, whose emitter is coupled to reference potential, and whose base is connected to the base of a second transistor of the current mirror circuit, which second transistor has its emitter connected to the reference potential and its collector to its base and to the emitter of a third transistor of the current mirror circuit, the base of said third transistor being connected to the input of the Wilson current mirror circuit and the collector of this transistor forming the output of the current mirror circuit, in that the input of the circuit arrangement is connected to the output of a current amplifier circuit and, via the capacitance to the node between the second and the third transistor of the Wilson current mirror circuit, in that the output of the Wilson current mirror circuit is connected to the input of the current amplifier circuit, and in that in addition constant currents of equal magnitude are applied to the input and to the output of the Wilson current mirror circuit.

Again a current mirror circuit is used to amplify the effect of the current through the capacitance. However, in this case a Wilson current mirror is used, which in known manner comprises three transistors and feedback of the amplification.

The input signal of the entire circuit arrangement is applied to the node between the second and the third transistor of the Wilson current mirror via the capacitance whose effect is to be boosted electronically. Moreover, the input of the entire circuit arrangement is connected to the output of the current amplifier circuit, whose input is connected to the output of the Wilson current mirror.

At its input the Wilson current mirror receives a constant current of given magnitude. The output of the Wilson current mirror also receives a constant current, whose ratio to the current applied to its input is equal to the current gain factor of the current mirror circuit. Thus, if the current mirror circuit amplifies the input current by a factor of 2, the current applied to the output of the Wilson current mirror is also a factor of 2 as large as the current applied to the input.

In this way it is achieved that the current applied to the input is compensated for at the output of the Wilson current mirror. However, since in addition the current flowing through the capacitance is applied to the node between the second and the third transistor, this current will also appear at the output of the Wilson current mirror. Here, this current is again withdrawn and applied to the current amplifier circuit. The output signal of the current amplifier circuit and the current through the capacitance together form the input/output current of the entire circuit arrangement.

This second embodiment, with the Wilson current mirror, is still very simple but as compared to the first embodiment it has the additional advantage that the node between the second and the third transistor of the Wilson current mirror, to which node the current through the capacitance is applied, has a comparatively low impedance relative to ground. This is important because, if possible, the current should be a purely capacitive current and resistive components in the load are therefore undesirable.

If, as in a variant of this second embodiment, the slope of the current-gain characteristic of the current amplifier circuit is adjustable, the degree of electronic amplification of the effect of the capacitance will be adjustable. Thus, the result is an electronically generated capacitance of adjustable magnitude. Such a circuit is suitable for a variety of uses, particularly, as in a further variant, for a voltage-controlled oscillator.

In a further variant of the second embodiment of the invention the current amplifier circuit has such a current gain that the current which flows into the circuit arrangement is larger than the current flowing through the capacitance.

Owing to the design of the circuit arrangement the input current of the entire circuit arrangement is the sum of the current through the capacitance and the output current of the current amplifier. If the current gain characteristic of this current amplifier is such that the current through the capacitance and the output current of the current amplifier are combined with the same sign, the sum of these two currents, i.e. a current larger than the current through the capacitance, will appear at the input of the entire circuit arrangement. The phase of the two currents corresponds to that of the current through the capacitance. This means that a real amplification is obtained, for which the magnitude of the input current of the circuit arrangement is a selectable amount larger than the current through the capacitance.

However, as in a further variant of the second embodiment of the invention, it is also possible that the current amplifier circuit has such a current gain that the current which flows into the circuit arrangement is smaller than the current flowing through the capacitance and is in phase or 180° phase-shifted. The characteristic of the current amplifier or the sign of the amplification is now such that the current through the capacitance and the output current of the current amplifier circuit are subtracted from one another, i.e. have opposite signs, and are thus added to the input signal of the entire circuit arrangement. This makes it possible for the input current of the circuit arrangement to assume capacitively a value between zero and the current through the capacitance. However, if the gain of the current amplifier circuit is selected to be high, this current can be larger than the current through the capacitance. An appropriate combination then results in a current at the input of the entire circuit arrangement, which current is 180 degrees phase-shifted relative to the current through the capacitance. This may be regarded as a negative effect of the capacitance so the current is in fact inductive. This inductive current can reach a maximum value equal to the magnitude of the current through the capacitance. The maximum value of the current then depends on the dimensioning of the current amplifier circuit.

The current amplifier for the arrangement in accordance with the second embodiment can in particular be constructed as a differential amplifier, whose output signals are suitably combined by means of three current mirror circuits, the current at the output, amplified by the gain factor of the differential amplifier, and the current through the capacitance then being added to the input current of the entire circuit arrangement.

BRIEF DESCRIPTION OF THE DRAWINGS

Two exemplary embodiments of the invention will now be described in more detail with reference to the drawings. In the drawings:

FIG. 3 shows the circuit arrangement of FIG. 2 with a differently constructed current amplifier, which can also produce a negative effect of the current through the capacitance.

DESCRIPTION OF THE PREFERRED EMBODIMENTS

Figure 1:
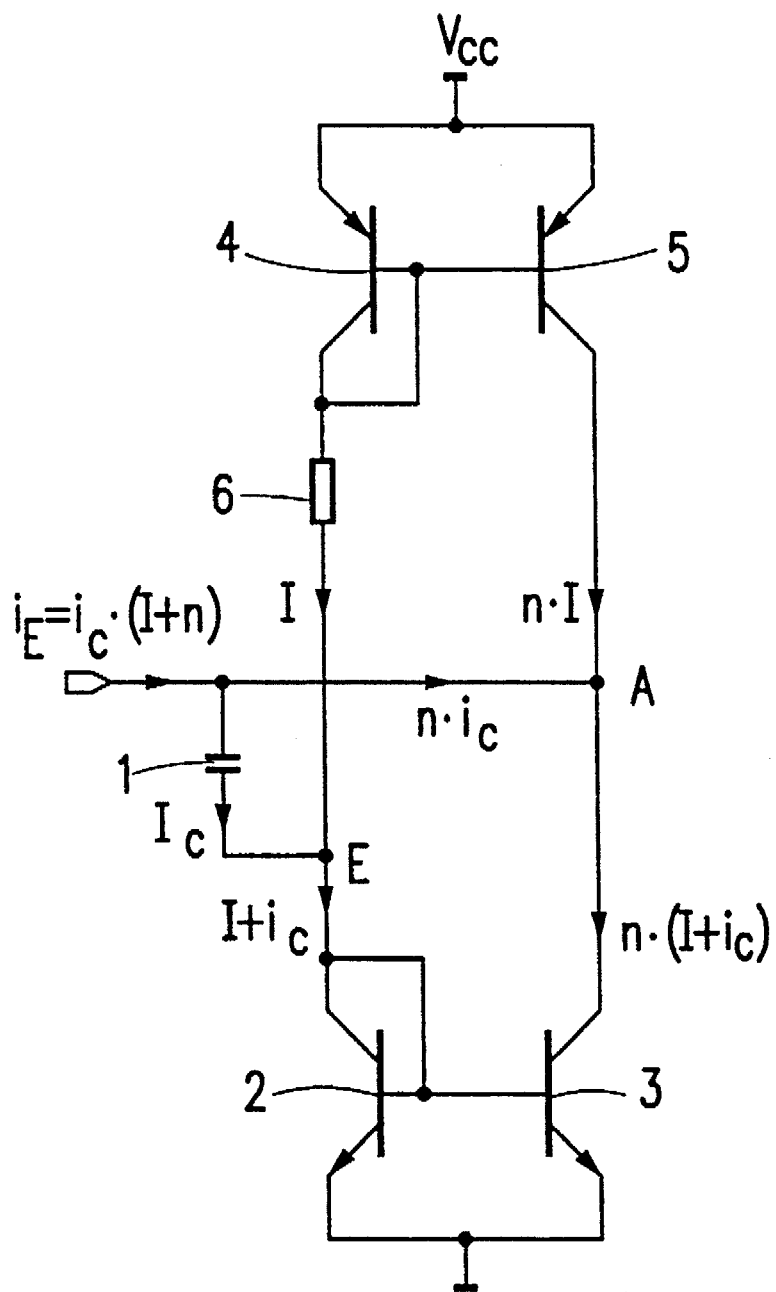
FIG. 1 shows an example of the circuit arrangement in accordance with the first embodiment.

A circuit arrangement shown in FIG. 1, for amplifying the effect of a capacitance 1, comprises a current mirror circuit with an input transistor 2 and an output transistor 3.

At its input this current mirror circuit receives a constant current I, to which the current $i_c$ flowing through the capacitance 1 is added. This results in a current I+$i_c$ flowing at the input of the transistor 2 of the current mirror circuit.

This current appears at the output of the current amplifier 3, amplified by the ratio between the area of the transistor 2 and the area of the transistor 3. Hereinafter, this area ratio is designated n. The current in the output of the current amplifier circuit, i.e. in the collector of the transistor 3, is consequently n·(I+$i_c$).

Since a constant current I·n is impressed on the output of the current amplifier circuit a residual current n·$i_c$ is available for the circuit section connected to the input of the entire circuit arrangement. This current is added to the current $i_c$ through the capacitance with the same sign, so that a current $i_c$·(1+n) flows at the input of the entire circuit arrangement.

Thus, the result is that the effect of the current $i_c$ through the capacitance is amplified. If the area ratio is n=1 a current will flow at the input with twice the magnitude of and in phase with the current through the capacitance. The result is that the effect of the capacitance has actually been amplified electronically.

In the exemplary embodiment shown in FIG. 1 the constant current I, which is fixedly impressed on the input of the first current mirror circuit, is adjustable via a resistor 6 connected to the input of a second current mirror circuit, which comprises an input transistor 4 and an output transistor 5. This second current mirror circuit is connected to a supply voltage $V_{cc}$. The second current mirror circuit has the same gain as the first current mirror circuit, i.e. its transistors have the same area ratio n as the transistors 2 and 3 of the first current mirror circuit. Thus, the second current mirror circuit has an output current n·I, which reaches the output of the first current mirror circuit.

The currents I and n·I generated by the second current mirror circuit can also be generated by means of current sources or other circuit elements.

Figure 2:
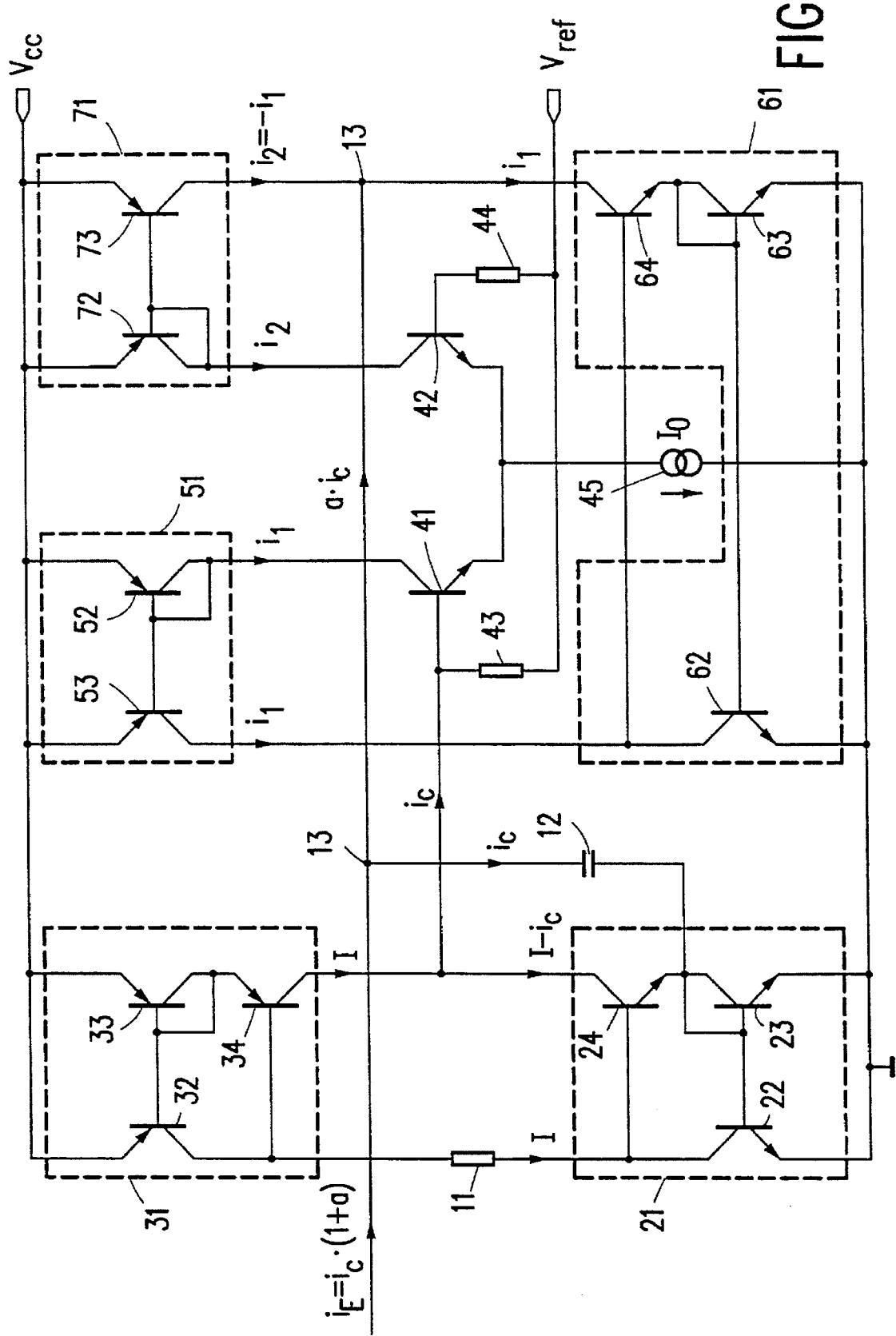
FIG. 2 shows an example of the circuit arrangement in accordance with the second embodiment.

FIG. 2 shows a circuit arrangement for electronically amplifying the effect of a capacitance in accordance with the second embodiment of the invention.

FIG. 2 shows a Wilson current mirror circuit 21 comprising a first transistor 22, a second transistor 23 and a third transistor 24. The collector of the transistor 22 forms the input of the Wilson current mirror circuit 21. The emitters of the transistors 22 and 23 are connected to a reference potential. The base connections of the transistors 22 and 23 are connected to one another and to a node between the transistor 23 and the transistor 24, which node is also connected to the collector of the transistor 23 and the emitter of the transistor 24. The base of the transistor 24 is connected to the input of the Wilson current mirror circuit. The collector of the transistor 24 constitutes the output of the Wilson current mirror circuit.

A constant current I, which is adjustable by means of a resistor 11, is impressed on the input of the Wilson current mirror 21. The resistor 11 is coupled to the supply potential $V_{cc}$ via an input transistor 32 of a second Wilson current mirror 31. The second Wilson current mirror circuit comprises a second transistor 33 and a third transistor 34, which are arranged in known manner similarly to the Wilson current mirror circuit 21 but which have the supply potential $V_{cc}$ as their reference potential.

When it is assumed that both the Wilson current mirror 21 and the Wilson current mirror 31 have unity current gain, the current I applied to the output of the first Wilson current mirror 21 also flows at the output of the second Wilson current mirror 31. Moreover, a current $i_c$ is taken from this output. This can be explained by the fact that the input signal of the entire circuit arrangement is coupled to the node between the second transistor 23 and the third transistor 24 of the Wilson current mirror 21 via a capacitance 12. A current $i_c$ flowing through this capacitance will also appear at the output of the first Wilson current mirror circuit 21. Since the constant current I impressed on the input of the Wilson current mirror circuit 21 also appears at the output, this current will be compensated for by the current of equal magnitude I of the second Wilson current mirror 31. This results in a residual current $i_c$ at the output.

This current is applied to a differential amplifier circuit comprising a first transistor 41, a second transistor 42, a first resistor 43, a second resistor 44 and a current source 45.

The current $i_c$ reaches the base of the transistor 41 and the resistor 43, whose other end is at a reference potential $V_{ref}$. Likewise, the resistor 44 is arranged between this reference potential and the base of the transistor 42. The emitters of the two transistors are connected to one another and to the current source 45, which supplies a current $I_0$. The collectors of the transistors 41 and 42 form the outputs of the differential amplifier. The current $i_c$ produces a voltage drop across the resistor 43 (the base of the transistor 41 forms a comparatively high impedance input. This voltage drop is halved at each of the emitter diodes of the transistor 41 and the transistor 42. The base of the transistor 42 is at the reference voltage $V_{ref}$ for alternating current. Since the diode of the transistor 42 is oppositely poled it produces a current with a 180° phase-shift.

If the transconductance g of the transistors 41 and 42 is $$g = \frac{I_0/2}{V_T},$$

where $V_T$ is the thermal voltage of the transistors, the output current $i_1$ of the transistor 41 will be $$i_1 = \frac{i_c \cdot R_{43}}{2} \cdot \frac{I_0/2}{V_T}$$

The output current $i_2$ of the transistor 42 of the differential amplifier has the same value but an opposite sign, so that $i_2 = -i_1$.

The current i is the input current of a current mirror circuit 51, which in conventional manner comprises two transistors 52 and 53, whose emitters are coupled to the supply voltage $V_{cc}$. This also results in a current $i_1$ at the output of this current mirror circuit 51, which current is applied to an input of a Wilson current mirror circuit 61. The current mirror circuit 61, in the same way as the current mirror circuit 21, comprises a first transistor 62, a second transistor 63 and a third transistor 64. The current $i_1$ again flows at the output of this Wilson current mirror circuit 61.

The current $i_2$, which flows in the collector of the amplifier 42, reaches an input of a further current mirror circuit 71 which, in the same way as the current mirror circuit 51, comprises an input transistor 72 and an output transistor 73. At its output this current mirror circuit 71 supplies the current $i_2 = -i_1$.

FIG. 2 shows a node 13 and hereinafter only the signal currents, i.e. alternating currents, are considered and not the direct currents that flow. For this node the following current sum is valid:
the input current $I_E = i_c + i_1 - i_2$
which, as $i_2 = -i_1$, yields $I_E = i_c + 2 \cdot i_1$.
Since $$i_1 = \frac{i_c \cdot R_2}{2} \cdot \frac{I_0/2}{V_T}$$

it holds that $$i_e = i_c \cdot \left(1 + R_2 \cdot \frac{I_0/2}{V_T}\right)$$

Herein, the term $$I_0 \cdot \frac{R_2/2}{V_T}$$

is assumed to be the current gain factor a of the differential amplifier.

The input current of the entire circuit arrangement is consequently $i_e = i_c \cdot (1+a)$.

In the embodiment shown in FIG. 2 the currents $i_c$ and $a \cdot i_c$ in the node 13 are added to one another with the same sign and the same phase, so that the input current of the entire circuit arrangement $i_e = i_c \cdot (1+a)$ is larger than the current $i_c$. This current is in phase with the current $i_c$ through the capacitance 12 but is larger. The factor a can be variable if the current $I_0$ of the current source 45 is variable. If the current $I_0$ changes the factor a will change accordingly. By varying the current $I_0$ of the differential amplifier it is consequently possible to vary the electronic amplification of the effect of the capacitance 12 or the current $i_c$ flowing through this capacitance. Therefore, the factor a may be regarded as being variable and thus allows a variable capacitance to be simulated. This property renders the circuit suitable for, for example, voltage-controlled oscillators.

FIG. 3 shows a circuit arrangement similar to that in FIG. 2 which differs, however, in that the current $i_c$ from the node between the two outputs of the current mirrors 31 and 21 is not applied to the node between the resistor 43 and the differential amplifier 41 but to the node between the resistor 44 and the transistor 42 of the differential amplifier. In this way it is achieved that the differential amplifier supplies output currents with opposite signs.

In FIG. 3 this is indicated by the negative signs of the output currents $i_2$ and $i_1$ of the current mirror circuits 71 and 61, respectively.

For the overall current or input current $i_E$ of the entire circuit arrangement, this means that: $i_E=i_c\cdot(1-a)$. The current $i_c$ through the capacitance 12 and the current from the node between the outputs of the current mirror circuits 71 and 61 are now added to one another in such a manner that the output current of the two current mirror circuits has a sign opposite to that of the current $i_c$ through the capacitance 12. Consequently, the current $i_E$ of the entire circuit arrangement is smaller than the current $i_c$ through the capacitance. Moreover, it is possible to make the current -a·$i_c$, supplied by the outputs of the current mirror circuits 71 and 61, larger than the current $i_c$ through the capacitance 12. As a result of this, it is possible to form a negative capacitance. The current $i_E$ in the entire circuit arrangement is thus 180° phase-shifted relative to the capacitive current through the capacitance 12. This negative capacitance may also be regarded as an inductance. By a suitable choice of the summation of the output currents of the two current mirrors 61 and 71 and of the current through the capacitance 12 it is also possible to form a variable inductance or a negative capacitance.

The embodiments in FIGS. 2 and 3 show that, depending on the choice of the current amplifier, which in the present examples is formed by the differential amplifier and the current mirrors 51, 61 and 71, the current through the capacitance and the output current of this current amplifier can be combined either so as to amplify the effect of the capacitance or to reduce the effect of the capacitance, which reduction may be to the extent that the effect of a negative capacitance is obtained, which acts as an inductance.

I claim:

1. A circuit for amplifying the capacitance effect of a capacitance comprising: means connecting an input of the circuit to an output of a current mirror circuit and, via the capacitance, to an input of the current mirror circuit, means for applying to said input a first constant current (I), the degree of amplification of the effect of the capacitance being dependent on the area ratio n between an input transistor of the current mirror circuit and an output transistor of the current mirror circuit, and wherein a second constant current (n·I) is applied to the output of the current mirror circuit, said second constant current being equal to the first constant current applied to the input of the current mirror circuit multiplied by the area ratio n, where n is an integer in the ratio between the area of said input transistor and the area of said output transistor.

2. A circuit for amplifying the capacitance effect of a capacitance as claimed in claim 1, wherein said means for applying comprises a second current mirror circuit, the input of the first current mirror circuit is coupled to an input branch of said second current mirror circuit via a resistor, the outputs of the two current mirror circuits are coupled to one another, and the two current mirror circuits have the same area ratio between their input and output transistors.

3. A capacitance amplifying circuit as claimed in claim 1, wherein:

said means for applying a constant current comprises a second current mirror circuit having its input branch connected in a first series circuit with the input transistor of the first current mirror circuit, and wherein an output branch of the second current mirror circuit is connected in a second series circuit with the output transistor of the first current mirror circuit, said second current mirror circuit having a current gain substantially equal to the area ratio n of the first current mirror circuit thereby to apply said constant current (nI) to the output of the first current mirror circuit.

4. A capacitance amplifying circuit as claimed in claim 3 wherein said capacitance is connected between said input of the capacitance amplifying circuit and a Junction point between the input transistor of the first current mirror circuit and the input branch of the second current mirror circuit, said junction point comprising the input of the first current mirror circuit, and said input of the capacitance amplifying circuit is directly connected to the output of the first current mirror circuit.

5. A circuit for amplifying the effect of a capacitance comprising: a Wilson current mirror circuit which comprises a first transistor whose collector forms the input of the current mirror circuit, Whose emitter is coupled to a reference potential, and whose base is connected to the base of a second transistor of the current mirror circuit, said second transistor having its emitter connected to the reference potential and its collector to its base and to an emitter of a third transistor of the current mirror circuit, the base of said third transistor being connected to the input of the Wilson current mirror circuit and the collector thereof forming an output of the current mirror circuit, wherein an input of the circuit for amplifying the capacitance effect of a capacitance is connected to an output of a current amplifier circuit and, via the capacitance to a node between the second and the third transistor of the Wilson current mirror circuit, in that the output of the Wilson current mirror circuit is connected to an input of the current amplifier circuit, and means for applying constant currents (I) of equal magnitude to the input and to the output of the Wilson current mirror circuit.

6. A circuit for amplifying the capacitance effect of a capacitance as claimed in claim 5, wherein the slope of the current-gain characteristic of the current amplifier circuit is adjustable.

7. A circuit for amplifying the capacitance effect of a capacitance as claimed in claim 5 wherein the current amplifier circuit has a current gain such that the current which flows into the circuit for amplifying the capacitance effect of a capacitance is larger than the current flowing through the capacitance.

8. A circuit for amplifying the capacitance effect of a capacitance as claimed in claim 5 wherein the current amplifier circuit has a current gain such that the current which flows into the circuit for amplifying the capacitance effect of a capacitance is smaller than the current flowing through the capacitance and is in phase or 180° phase-shifted relative thereto.

9. A circuit for amplifying the capacitance effect of a capacitance as claimed in claim 5 wherein the current amplifier circuit comprises a differential amplifier.

10. A circuit for amplifying the capacitance effect of a capacitance as claimed in claim 9, wherein output signals of the differential amplifier are combined by means of three current mirror circuits.

11. A circuit for amplifying the capacitance effect of a capacitance as claimed in claim 6, wherein the current amplifier circuit has a current gain such that the current which flows into the circuit for amplifying the capacitance effect or a capacitance is larger than the current flowing through the capacitance.

12. A circuit for amplifying the capacitance effect of a capacitance as claimed in claim 7, wherein the current amplifier circuit has a current gain such that the current which flows into the circuit for amplifying the capacitance effect of a capacitance is smaller than the current flowing through the capacitance and is in phase or 180° phase-shifted.

13. A circuit for amplifying the capacitance effect of a capacitance as claimed in claim 7, wherein the current amplifier circuit comprises a differential amplifier.

14. A circuit for amplifying the capacitance effect of a capacitance as claimed in claim 8, wherein the current amplifier circuit comprises a differential amplifier.

15. A voltage controlled oscillator comprising a circuit for amplifying the capacitance effect of a capacitance as claimed in claim 5 wherein the current gain factor of the current amplifier circuit is variable so as to vary the effective capacitance of said capacitance.

16. A circuit for amplifying the capacitance effect of a capacitance as claimed in claim 5 wherein the current amplifier circuit provides an output current that is 180° out of phase with the current through the capacitance and is greater than the capacitance current.

17. A circuit for amplifying the capacitance effect of a capacitance as claimed in claim 5 wherein said means for applying constant currents to the input and to the output of the Wilson current mirror circuit comprises a further current mirror circuit having an input branch connected in a first series circuit with the input transistor of the Wilson current mirror circuit and an output branch connected in a second series circuit with the second and third transistors of the wilson current mirror circuit.

18. A circuit for amplifying the capacitance effect of a capacitance as claimed in claim 9 wherein said differential amplifier comprises fourth and fifth transistors having respective main electrodes connected in common via an adjustable current source to a point of reference potential whereby adjustment of the adjustable current source varies the capacitance effect as seen at the input of the circuit for amplifying the capacitance effect of a capacitance.

* * * * *